(12) United States Patent
Yang et al.

(10) Patent No.: US 8,385,149 B2
(45) Date of Patent: Feb. 26, 2013

(54) GATE OXIDE BREAKDOWN-WITHSTANDING POWER SWITCH STRUCTURE

(75) Inventors: Hao-I Yang, Hsinchu (TW); Ching-Te Chuang, Taipei County (TW); Wei Hwang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 198 days.

(21) Appl. No.: 13/075,682

(22) Filed: Mar. 30, 2011

(65) Prior Publication Data

US 2012/0087196 A1    Apr. 12, 2012

(30) Foreign Application Priority Data

Oct. 8, 2010  (TW) .............................. 99134465 A

(51) Int. Cl.
*G11C 5/14*    (2006.01)
(52) U.S. Cl. ........................ 365/226; 365/154
(58) Field of Classification Search .................. 365/226, 365/154
See application file for complete search history.

(56) References Cited

U.S. PATENT DOCUMENTS

| | | | |
|---|---|---|---|
| 2007/0018257 A1* | 1/2007 | Joshi .............................. | 257/393 |
| 2007/0236983 A1* | 10/2007 | Wang et al. .................... | 365/154 |
| 2009/0073782 A1* | 3/2009 | Hanafi et al. ............. | 365/189.09 |

OTHER PUBLICATIONS

Wang, Yih et al., "A 1.1 GHz 12 μA/Mb-Leakage SRAM Design in 65 nm Ultra-Low-Power CMOS Technology With Integrated Leakage Reduction for Mobile Applications", IEEE Journal of Solid-State Circuits, Jan. 2008, pp. 172-179, vol. 43, No. 1.
Sharifkhani, Mohammed et al., "Segmented Virtual Ground Architecture for Low-Power Embedded SRAM", IEEE Transactions on Very Large Scale Integration (VLSI) Systems, Feb. 2007, pp. 196-205, vol. 15, No. 2
Wang, Y. et al., "A 4.0 GHz 291Mb Voltage-Scalable SRAM Design in 32nm High-K Metal-Gate CMOS with Integrated Power Management", 2009 IEEE International Solid-State Circuits Conference, 2009, pp. 456-458.

* cited by examiner

*Primary Examiner* — Hoai V Ho
*Assistant Examiner* — Tri Hoang
(74) *Attorney, Agent, or Firm* — Muncy, Geissler, Olds & Lowe, PLLC

(57) ABSTRACT

The present invention proposes a gate oxide breakdown-withstanding power switch structure, which is connected with an SRAM and comprises a first CMOS switch and a second CMOS switch respectively having different gate-oxide thicknesses or different threshold voltages. The CMOS switch, which has a normal gate-oxide thickness or a normal threshold voltage, provides current for the SRAM to wake up the SRAM from a standby or sleep mode to an active mode. The CMOS switch, which has a thicker gate-oxide thickness or a higher threshold voltage, provides current for the SRAM to work in an active mode. The present invention prevents a power switch from gate-oxide breakdown lest noise margin, stabilization and performance of SRAM be affected.

6 Claims, 7 Drawing Sheets

GATE OXIDE BREAKDOWN-WITHSTANDING POWER SWITCH STRUCTURE

BACKGROUND OF THE INVENTION

1. Field of the Invention

The present invention relates to a gate oxide breakdown-withstanding power switch structure applied to SRAM, particularly to a power switch using two different gate-oxide thicknesses or two different threshold voltages to prevent a power switch gate-oxide breakdown from happening.

2. Description of the Related Art

More embedded memories are integrated on chips to support more powerful computation engines, leading to low-power and reliable memory design techniques being more important. At present, most of advanced SRAMs (Static Random Access Memory) utilize a power switch to reduce leakage current and power consumption in the standby/sleep mode of SRAM. Refer to FIG. 1 a diagram schematically showing that a conventional power switch is applied to SRAM. The power switch structure comprises a P-type transistor 10 and an N-type transistor 12. The source of the P-type transistor 10 and the drain of the N-type transistor 12 are connected with a voltage source VDD. The drain of the P-type transistor 10 and the source of the N-type transistor 12 are connected with the voltage terminal VVDD of an SRAM cell array 14. The other terminal of the SRAM cell array 14 is connected with the ground GND. The gate of the P-type transistor 10 receives a control signal HPG. If the control signal is at a low level, the P-type transistor 10 turns on, and VDD will charge VVDD to a potential level identical to that of VDD. At this moment, the cell array 14 is allowed to be read or written. If the control signal is at a high level, the P-type transistor 10 turns off, and the voltage level of VVDD is lower than the gate voltage level of the N-type transistor 12 by a threshold voltage. The cell array 14 is in a standby mode or a sleep mode. By turning off P-type transistor 10, leakage current of the cell array 14 can be significantly decreased. The N-type transistor 12 is used to bias VVDD of the cell array 14 at a proper voltage level for data retention.

The gate oxide thickness becomes thinner as technology scaling. However, the voltage level of power supply remains unchanged. These result in a high gate-oxide electric-field and gate-oxide breakdown. Therefore, gate-oxide breakdown becomes a critical factor in sub-100 nm SRAM design.

The breakdown or damage of the gate oxide of a power switch will seriously decrease the noise margin, stability, performance and reliability. Refer to FIGS. 1-3. In the active state of SRAM, the normal P-type transistor 10 turns on to provide a voltage source of 0.9V for the active cell array 14, as shown in FIG. 2. Once gate-oxide breakdown of the P-type transistor 10 occurs, a leakage path appears between the gate and drain of the P-type transistor 10, and this conduction path can be expressed as an equivalent resistance. If the equivalent resistance has a greater value, such $10^8\Omega$, VVDD voltage level of the cell array 14 is still 0.9V, and the impact of gate-oxide breakdown on SRAM is negligible. When gate-oxide breakdown is more serious and the equivalent resistance has a smaller value, such $10^4\Omega$, VVDD voltage level of the cell array 14 is only 0.1V. In such a case, gate-oxide breakdown of the P-type transistor 10 severely degrade noise margin, stability and performance of SRAM. As shown in FIG. 3, when SRAM is in standby or sleep mode, the normal P-type transistor 10 turns off. Once gate-oxide breakdown of the P-type transistor 10 occurs, a leakage path appears between the gate and drain of the P-type transistor 10. Referring to FIG. 3, the VVDD voltage level of the cell array 14 increases as equivalent resistance decreasing. This phenomenon leads to leakage current of the cell array 14 increasing.

Accordingly, the present invention proposes a gate oxide breakdown-withstanding power switch structure to overcome the abovementioned problem.

SUMMARY OF THE INVENTION

The primary objective of the present invention is to provide a gate oxide breakdown-withstanding power switch structure to overcome the problem that gate-oxide damage or breakdown of SRAM causes abnormal operation and affects noise margin, stability and performance.

Another objective of the present invention is to provide a gate oxide breakdown-withstanding power switch structure to increase time-to-breakdown of the dielectric and maintain the performance of the power switch, whereby the life time of the power switch increases.

To achieve the abovementioned objectives, the present invention proposes a gate oxide breakdown-withstanding power switch structure, which is connected with an SRAM, and which comprises a first CMOS (Complementary Metal Oxide Semiconductor) switch connected with a voltage source, receiving a first control signal, temporarily turning on to provide the voltage source for the SRAM; and a second CMOS switch connected with the voltage source, receiving a second control signal, turning on to provide the voltage source for the SRAM when the first CMOS switch is no more turned on, wherein when the first CMOS switch and the second CMOS switch are turned on, the gate electric field of the first CMOS switch is greater than that of the second CMOS switch.

Below, the embodiments are described in detail to make easily understood the objectives, technical contents and accomplishments of the present invention.

DETAILED DESCRIPTION OF THE INVENTION

Figure 1:
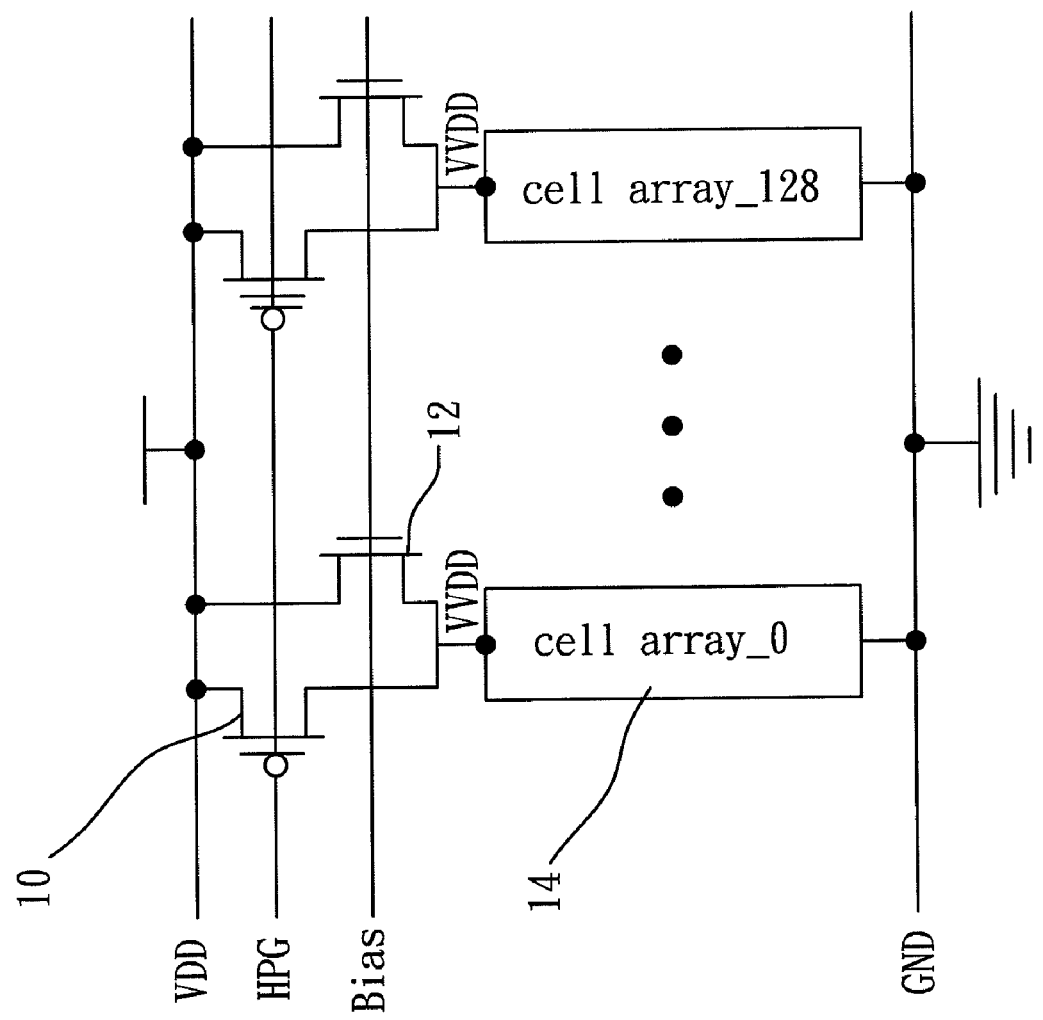
FIG. 1 is a diagram schematically showing that a conventional power switch for SRAM.
Figure 2:
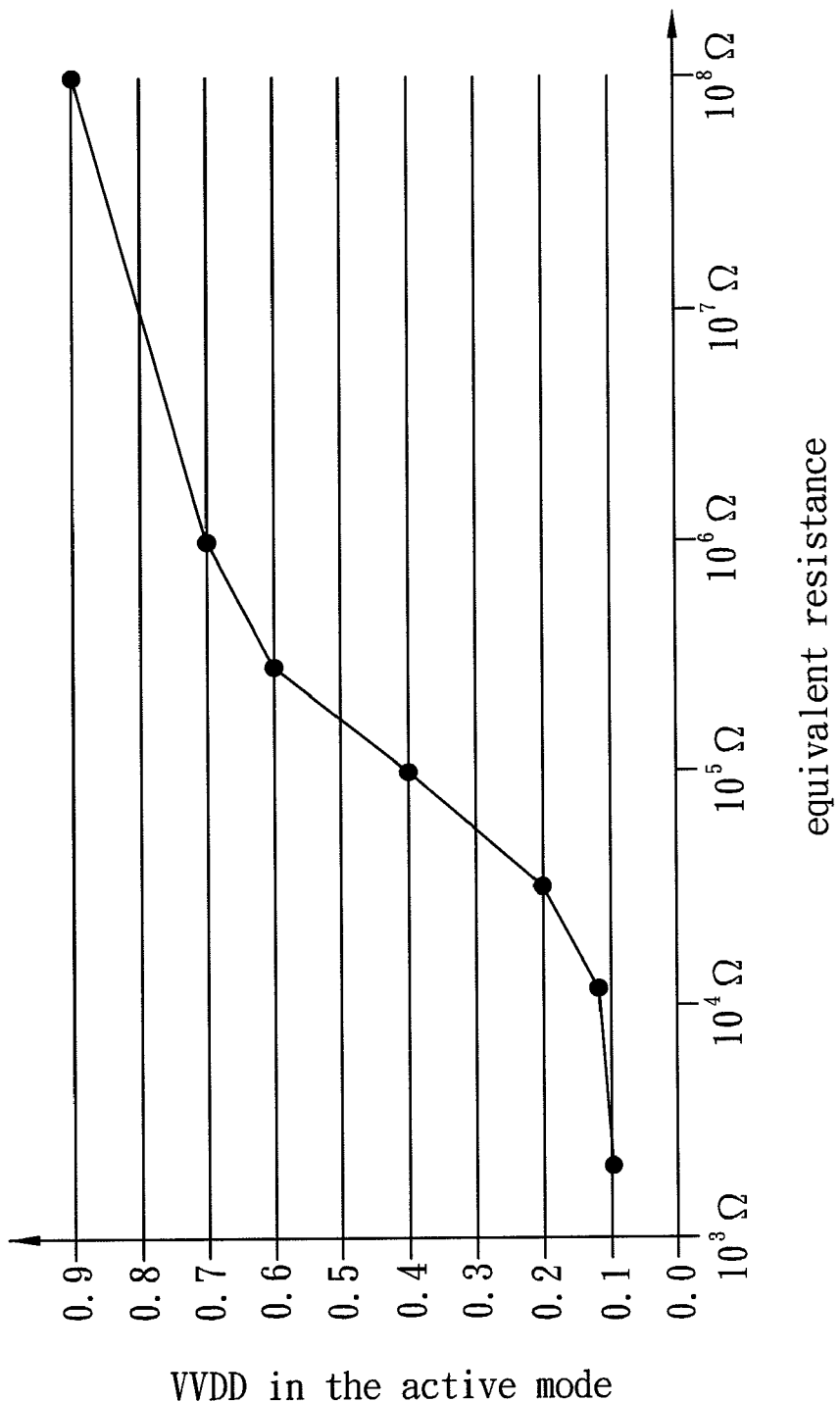
FIG. 2 is a diagram schematically showing the relation between VVDD voltage level and gate-oxide breakdown equivalent resistance of a conventional power switch during active mode.
Figure 3:
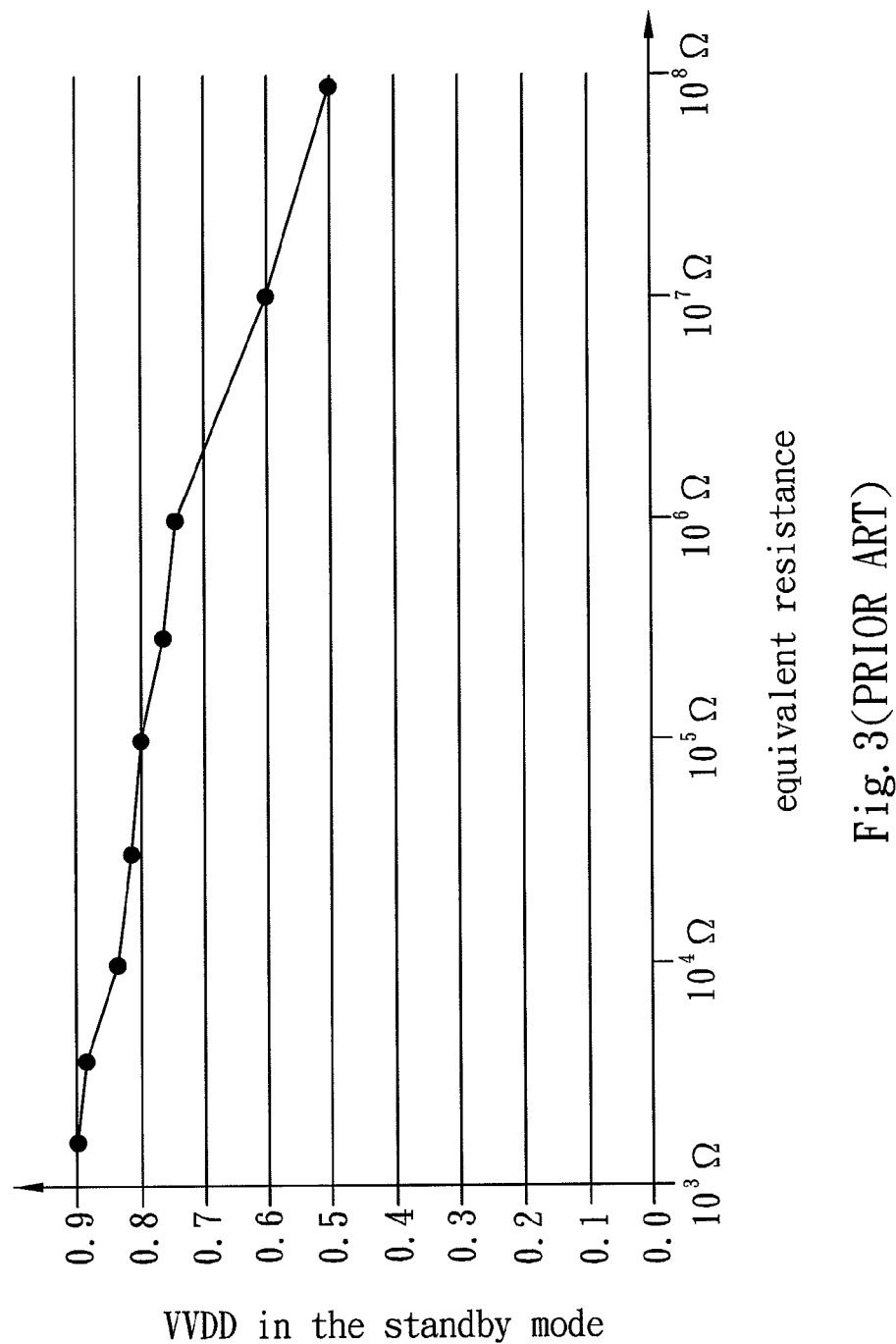
FIG. 3 is another diagram schematically showing the relation between VVDD voltage level and gate-oxide breakdown equivalent resistance of a conventional power switch during standby mode.
Figure 4:
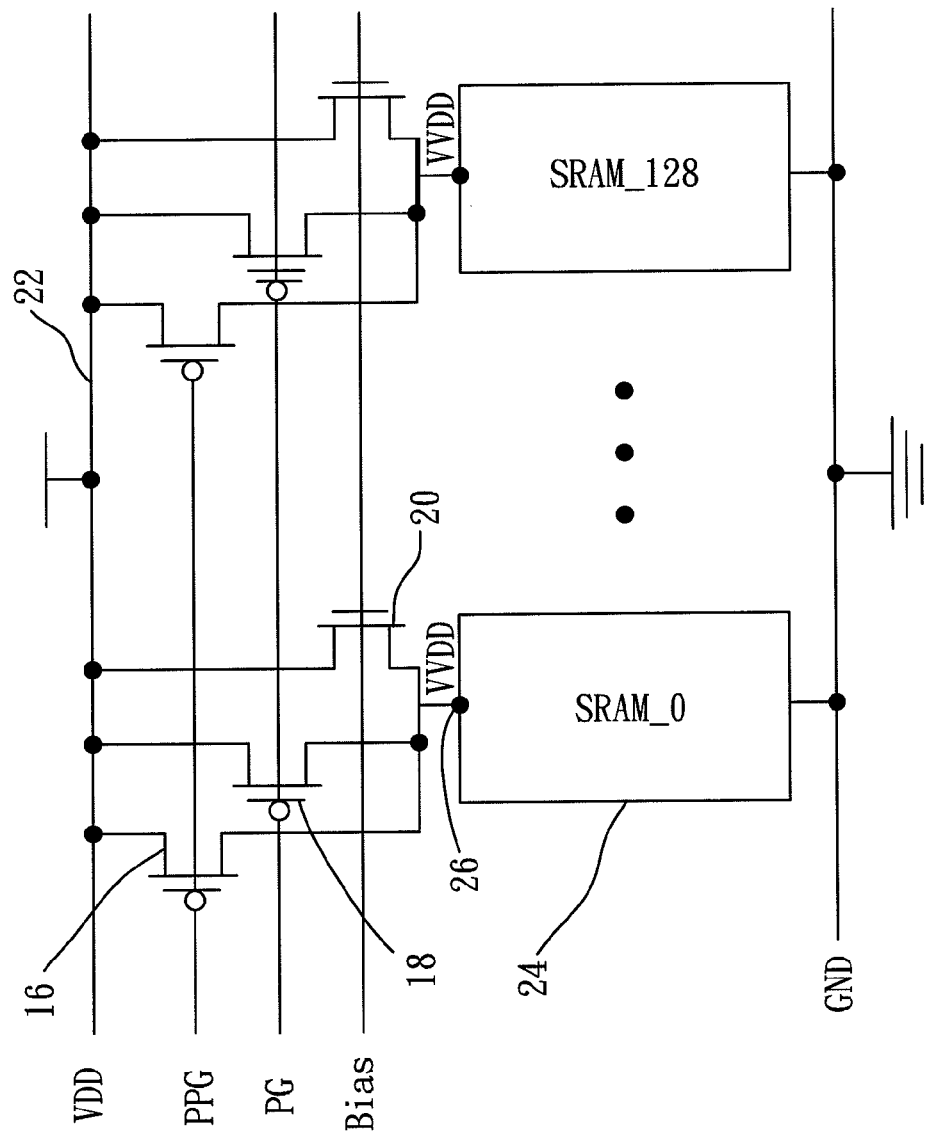
FIG. 4 is a diagram schematically showing the structure of a power switch applied to SRAM according to one embodiment of the present invention.

Refer to FIG. 4. The power switch structure of the present invention is applied to SRAM. In FIG. 4, a 128×128 SRAM cell array is used as an example. The power switch structure of the present invention comprises a first CMOS switch 16, a second CMOS switch 18 and a third CMOS switch 20. The source and drain of the first CMOS switch 16 are respectively connected with a first voltage source (VDD) 22 and a second voltage source (VVDD) 26 of an SRAM 24. The gate of the first CMOS switch 16 receives a first control signal (PPG). If the first control signal is at a low voltage level, the first switch 16 temporarily turns on to connect the first voltage source 22 to the second voltage source 26, whereby the first voltage source 22 can quickly charge the second voltage source 26. The other terminal of the SRAM 24 is connected to the ground (GND). The source and drain of the second CMOS switch 18 are respectively connected with the first voltage source 22 and the second voltage source 26 of the SRAM 24. The gate of the second CMOS switch 18 receives a second control signal (PG). When the voltage level of the second voltage source 26 is charged to VDD, the first CMOS switch 16 turns off, and the second CMOS switch 18 turns on to maintain the voltage level of operation of the second voltage source 26. The gate electric field (Eox) of the turned-on first CMOS switch 16 is greater than that of the turned-on second CMOS switch 18. The third CMOS switch 20 is a P-type or N-type transistor and functions as a diode. In this example, the third CMOS switch 20 is implemented by using an N-type transistor. The drain of the third CMOS switch 20 is connected with the first voltage source 22. The source of the third CMOS switch 20 is connected with the second voltage source 26 of the SRAM 24. The gate of the third CMOS switch 20 receives a bias voltage stabilization control signal for data retention of the SRAM 24.

The first CMOS switch 16 and the second CMOS switch 18 respectively have different gate-oxide thicknesses ($T_{OX}$) or respectively have different threshold voltages ($V_{TH}$). In order to overcome gate-oxide breakdown, the first CMOS switch 16 of the present invention adopts a normal gate-oxide thickness or a normal threshold voltage, and the second CMOS switch 18 of the present invention adopts a larger gate-oxide thickness or a higher threshold voltage. The first CMOS switch 16 is used to quickly to charge drive the second voltage source 26 of the SRAM 24. The second CMOS switch 18 has longer time-to-breakdown. The gate electric field can be defined as [gate voltage ($V_G$)-threshold voltage ($V_{TH}$)]/gate-oxide thicknesses ($T_{OX}$). The gate electric field determines the lifetimes of the first CMOS switch 16 and the second CMOS switch 18. Thus, increasing the gate-oxide thicknesses ($T_{OX}$) and/or the threshold voltage ($V_{TH}$) can decrease the gate electric filed strength, prevent the CMOS transistors from gate-oxide breakdown, and prolong the lifetime of CMOS transistors.

Figure 5:
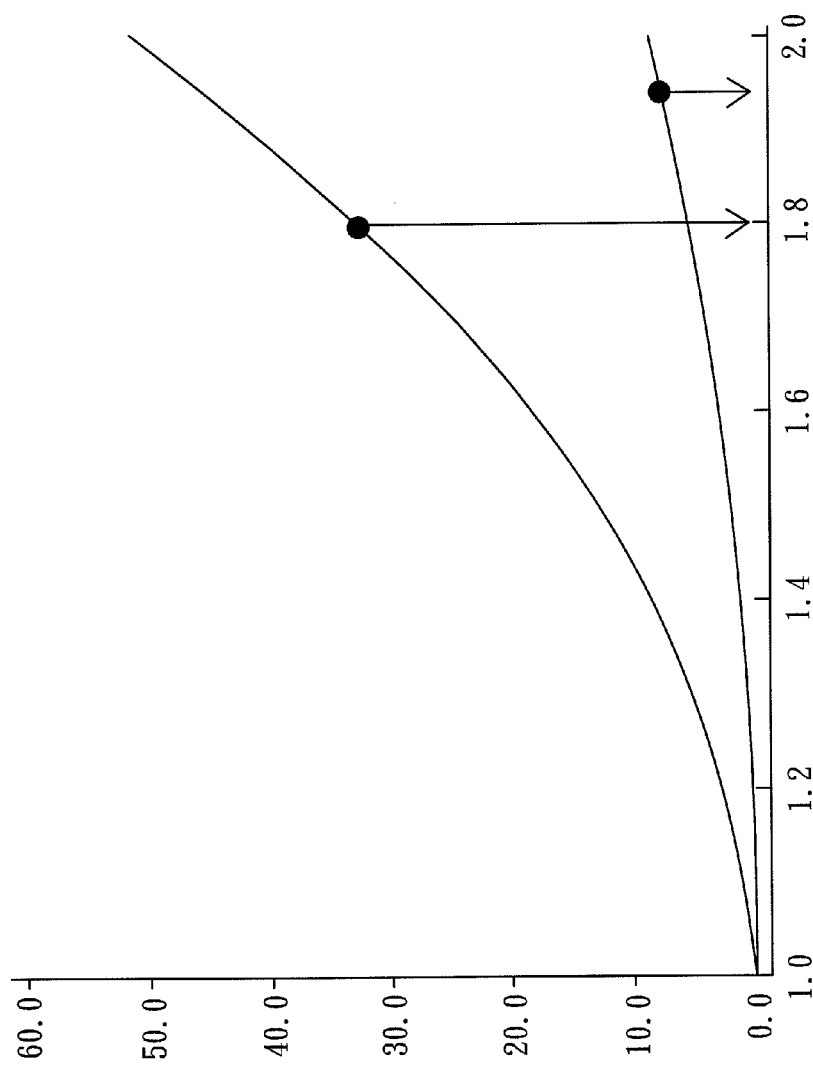
FIG. 5 is a diagram showing lifetime curves of CMOS switches respectively having different gate-oxide thicknesses or different threshold voltages according to one embodiment of the present invention.

Refer to FIG. 5, the lifetime curves of CMOS switches respectively have different gate-oxide thicknesses or different threshold voltages. The time-to-breakdown ($T_{BD}$) increases by 30 times when the gate-oxide thickness ($T_{OX}$) increases by 1.8 times. The time-to-breakdown ($T_{BD}$) increases by 10 times when the threshold voltage ($V_{TH}$) increases by 2 times. Therefore, increasing the gate-oxide thicknesses ($T_{OX}$) and/or the threshold voltage ($V_{TH}$) can prolong the lifetime of a power switch.

In one embodiment, the power switch of the present invention adopts two different gate-oxide thicknesses, wherein the first CMOS switch 16 has a first gate-oxide thickness ($T_{OX1}$) of 1.0 nm, which is smaller than 1.5 nm or 2.5 nm a second gate-oxide thickness ($T_{OX2}$) of the second CMOS switch 18, and wherein the first CMOS switch 16 has a first threshold voltage ($V_{TH1}$) identical to a second threshold voltage ($V_{TH2}$) of the second CMOS switch 18. For example, both threshold voltages of them are 200-250 mV. In another embodiment, the power switch of the present invention adopts two different threshold voltages, wherein the first CMOS switch 16 has a first threshold voltage ($V_{TH1}$) of 200-250 mV, which is smaller than 400-500 mV a second threshold voltage ($V_{TH2}$) of the second CMOS switch 18, and wherein the first CMOS switch 16 has a first gate-oxide thickness ($T_{OX1}$) identical to a second gate-oxide thickness ($T_{OX2}$) of the second CMOS switch 18. For example, both gate-oxide thicknesses of them are 1.0 nm.

Figure 6:
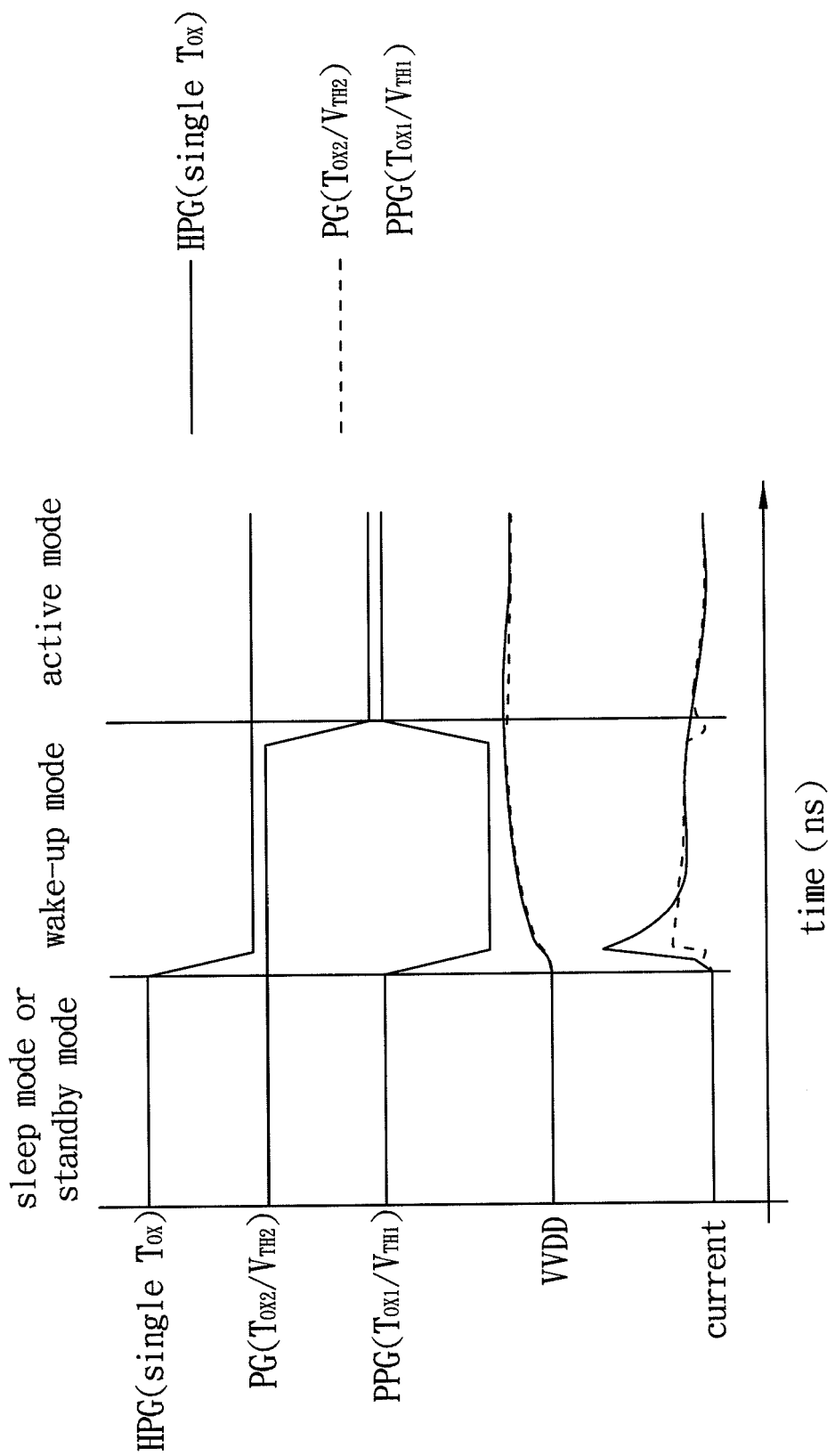
FIG. 6 is a timing diagram schematically showing that an SRAM shifts from a standby mode or sleep mode to an active mode according to one embodiment of the present invention.

Refer to FIG. 4 and FIG. 6. FIG. 6 is a timing diagram schematically showing SRAM wake-up transition from a standby mode or sleep mode to an active mode, wherein a power switch forming by two transistors with different gate-oxide thicknesses ($T_{OX1}$ and $T_{OX2}$) is compared with a power switch using a single transistor having a normal gate-oxide thickness (single $T_{OX}$). When the SRAM 24 is in a standby mode or a sleep mode, the first CMOS switch 16 and the second CMOS switch 18, which respectively receive a high-voltage-level first control signal (PPG) and a high-voltage-level second control signal (PG), are both turned off. In such a case, the second voltage source (VVDD) 26 of the SRAM 24 is lower than VDD to reduce leakage power. When the SRAM 24 is in a wake-up mode, the first control signal descends from a high voltage level to a low voltage level to temporarily turn on the first CMOS switch 16 and charge the second voltage source 26 to VDD. When the first CMOS switch 16 turns on temporarily, the second control signal of the second CMOS switch 18 remains at a high voltage level, and the second CMOS switch 18 still turns off. When the SRAM 24 is in an active mode, the first control signal rises from a low voltage level to a high voltage level, and the first CMOS switch 16 turns off. Meanwhile, the second control signal descends from a high voltage level to a low voltage level, and the second CMOS switch 18 turns on to maintain the voltage level of the second voltage source 26 of SRAM 24.

If a single CMOS transistor with a normal gate-oxide thickness is used as power switch of SRAM 24, it is stressed by a high voltage and easier to have gate-oxide breakdown. Distinct from the conventional design, the present invention uses the first CMOS switch 16 and the second CMOS switch 18 to respectively provide current to the SRAM 24 in the wake-up mode and the active mode. According to FIG. 6, the present invention not only can increase the access rate of the SRAM 24 but also can decrease the influence of the turn-on stress of the first CMOS switch 16 and the second CMOS switch 18. Therefore, the present invention can increase time-to-breakdown and promote stability and performance of the SRAM 24.

Figure 7:
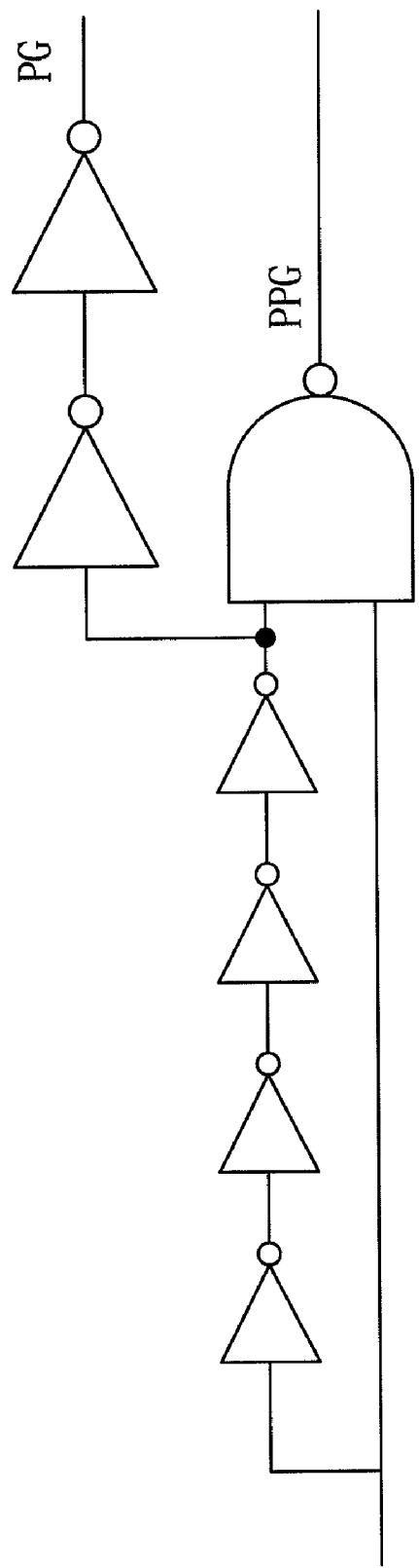
FIG. 7 is a diagram schematically showing the control circuit of the power switch in the wake-up mode shown in FIG. 6.

Refer to FIG. 7 a diagram schematically showing the control circuit in the wake-up mode shown in FIG. 6. The first gate-oxide thickness or the first threshold voltage of the first CMOS switch 16 is smaller than that of the second CMOS switch 18. Therefore, the first control signal (PPG) of the first CMOS switch 16 is an output of NAND, and the second control signal (PG) of the second CMOS switch 18 is an output of two series inverters. When the control signal is at a high voltage level, the NAND outputs a low-voltage-level signal. Thus, the first CMOS switch 16 turns on to quickly wake up the SRAM 24. At this time, an inverter chain delays the second control signal (PG) transfer. The second control signal is at a high level during the wake-up transition, and the second CMOS switch 18 turns off, until the delay period is over. Then, two series inverters output a low-voltage-level signal, and the second CMOS switch 18 turns on to maintain the voltage level of the second voltage source 26 of the SRAM 24. Therefore, the present invention can increase time-to-breakdown, maintain the performance and prolong the service life of a power switch.

The embodiments described above are only to exemplify the present invention but not to limit the scope of the present invention. Any equivalent modification or variation according to the spirit or characteristic of the present invention is to be also included within the scope of the present invention.

What is claimed is:

1. A gate oxide breakdown-withstanding power switch structure, which is connected with a static random access memory (SRAM), comprising
   a first complementary metal oxide semiconductor (CMOS) switch connected with a voltage source and said SRAM, receiving a first control signal, temporarily turned on to provide said voltage source for said SRAM and drive said SRAM to operate; and
   a second CMOS switch connected with said voltage source and said SRAM, receiving a second control signal, turned on to provide said voltage source for said SRAM and drive said SRAM to operate when said first CMOS switch is no more turned on,
   wherein when said first second CMOS switch and said second CMOS switch are separately turned on, said first CMOS switch has a gate electric field greater than that of said second CMOS switch.

2. The gate oxide breakdown-withstanding power switch structure according to claim 1, wherein when said second control signal is at a high level to turn off said second CMOS switch, said first control signal is at a low level to turn on said first CMOS switch to provide said voltage source for said SRAM and fast drive said SRAM to operate.

3. The gate oxide breakdown-withstanding power switch structure according to claim 2, wherein when said first control signal rises from a low level to a high level to turn off said first CMOS switch, said second control signal descends from a high level to a low level to turn on said second CMOS switch to provide said voltage source for said SRAM and maintain operation of said SRAM.

4. The gate oxide breakdown-withstanding power switch structure according to claim 1, wherein said first CMOS switch has a first gate-oxide thickness smaller than a second thickness of said second CMOS switch; meanwhile, said first CMOS switch has a first threshold voltage identical to a second threshold voltage of said second CMOS switch.

5. The gate oxide breakdown-withstanding power switch structure according to claim 1, wherein said first CMOS switch has a first threshold voltage lower than a second threshold voltage of said second CMOS switch; meanwhile, said first CMOS switch has a first gate-oxide thickness identical to a second gate-oxide thickness of said second CMOS switch.

6. The gate oxide breakdown-withstanding power switch structure according to claim 1 further comprising a third CMOS switch, which is connected with said voltage source and said SRAM and receives a voltage-stabilization control signal to stabilize voltage of said SRAM.

* * * * *